(12) United States Patent
Takakura et al.

(10) Patent No.: US 12,207,410 B2
(45) Date of Patent: Jan. 21, 2025

(54) WIRING CIRCUIT BOARD

(71) Applicant: NITTO DENKO CORPORATION, Osaka (JP)

(72) Inventors: Hayato Takakura, Osaka (JP); Naoki Shibata, Osaka (JP); Ryosuke Sasaoka, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 280 days.

(21) Appl. No.: 17/973,180

(22) Filed: Oct. 25, 2022

(65) Prior Publication Data

US 2023/0137656 A1    May 4, 2023

(30) Foreign Application Priority Data

Oct. 29, 2021    (JP) ................ 2021-178086

(51) Int. Cl.
    *H05K 1/18*      (2006.01)
    *H05K 1/05*      (2006.01)
    *H05K 1/09*      (2006.01)
    *H05K 3/32*      (2006.01)

(52) U.S. Cl.
CPC .............. *H05K 1/181* (2013.01); *H05K 1/05* (2013.01); *H05K 1/09* (2013.01); *H05K 3/32* (2013.01); *H05K 2201/0338* (2013.01); *H05K 2201/09209* (2013.01); *H05K 2201/10227* (2013.01)

(58) Field of Classification Search
CPC ............ H05K 1/181; H05K 1/05; H05K 1/09; H05K 3/32; H05K 2201/0338; H05K 2201/09209; H05K 2201/10227

USPC ......................................................... 361/748
See application file for complete search history.

(56) References Cited

U.S. PATENT DOCUMENTS

| | | | |
|---|---|---|---|
| 6,399,899 B1 * | 6/2002 | Ohkawa ................. | G11B 5/486 174/262 |
| 2009/0151994 A1 * | 6/2009 | Ohsawa ................. | H05K 1/112 174/261 |
| 2015/0245472 A1 | 8/2015 | Tanabe | |
| 2017/0171970 A1 | 6/2017 | Tanabe et al. | |
| 2021/0212208 A1 * | 7/2021 | Shibata .................. | H05K 1/118 |

FOREIGN PATENT DOCUMENTS

| | | |
|---|---|---|
| JP | 2011-175706 A | 9/2011 |
| JP | 2012-221539 A | 11/2012 |
| JP | 2015-158963 A | 9/2015 |

(Continued)

*Primary Examiner* — Binh B Tran
(74) *Attorney, Agent, or Firm* — Edwards Neils LLC; Jean C. Edwards, Esq.

(57) ABSTRACT

Provided is a wiring circuit board that allows the electrical connection between the elements and the terminals to be easy and sure. The wiring circuit board includes an insulating base layer, a plurality of wires with different thicknesses from each other, and an insulating cover layer sequentially toward an upper side. The wires include a first wire having the greatest thickness. The wiring circuit board further includes a plurality of terminals disposed on an upper surface of the insulating base layer. The terminals are electrically connected with the wires, respectively. The upper surfaces and of the terminals are each located at an upper side as compared to an upper surface of the insulating cover layer (a wire covering portion) covering the first wire.

7 Claims, 7 Drawing Sheets

(56) References Cited

FOREIGN PATENT DOCUMENTS

| JP | 2017-107629 A | 6/2017 |
|---|---|---|
| JP | 2019-149563 A | 9/2019 |
| JP | 2019-212349 A | 12/2019 |
| JP | 2021-150625 A | 9/2021 |

* cited by examiner

WIRING CIRCUIT BOARD

CROSS-REFERENCE TO RELATED APPLICATION

The present application claims priority from Japanese Patent Application No. 2021-178086 filed on Oct. 29, 2021, the contents of which are hereby incorporated by reference into this application.

BACKGROUND ART

The present invention relates to a wiring circuit board.

Wiring circuit boards each including an insulating base layer, wires with different thicknesses from each other, and an insulating cover layer sequentially toward an upper side are known (for example, see Patent document 1 below). The wires are electrically connected with terminals, respectively.

The upper surface of the insulating cover layer, which covers the thickest wire among the wires of the suspension board with circuit of Patent document 1, is located at an upper side as compared to the upper surface of the terminal continuing to the thickest wire.

CITATION LIST

Patent Document

Patent Document 1: Japanese Unexamined Patent Publication No. 2015-158963

SUMMARY OF THE INVENTION

Problem to be Solved by the Invention

An element may electrically be connected with the terminals in an up-down direction by moving the element downward to the upper sides of the terminals. When being projected in the up-down direction, the element overlaps the terminals and the insulating cover layer that is located in proximity to the terminals. The lower surface of the element is flat. Then, the lower surface of the element is brought into contact with the upper surface of the insulating cover layer covering the thickest wire before the lower surface of the element is brought into contact with the upper surface of the first terminal. Thus, there is a disadvantage that the element fails to smoothly be connected to the first terminal.

The present invention provides a wiring circuit board that allows the electrical connection of the element with the terminals to be easy and sure.

Means for Solving the Problem

The present invention [1] includes a wiring circuit board including: an insulating base layer; a plurality of wires with different thicknesses from each other; and an insulating cover layer sequentially toward an upper side, wherein the plurality of wires include a first wire being the thickest wire among the plurality of wires, the wiring circuit board further comprises a plurality of terminals disposed on an upper surface of the insulating base layer, the terminals are electrically connected with the wires, respectively, and an upper surface of each of the terminals is located at an upper side as compared to an upper surface of the insulating cover layer covering the first wire.

In the wiring circuit board, the upper surface of each of the terminals is located at an upper side as compared to the upper surface of the insulating cover layer covering the first wire. Thus, when the element is moved downward to the terminals, the contact of the element with the upper surface of the insulating cover layer covering the first wire is suppressed. Thus, the lower surface of the element is easily and surely connected to the upper surfaces of the terminals.

The present invention [2] includes the wiring circuit board in [1], wherein the upper surface of each of the terminals is located 1 μm or more above the upper surface of the insulating cover layer.

In the wiring circuit board, the contact of the element with the upper surface of the insulating cover layer covering the first wire is more surely suppressed.

The present invention [3] includes the wiring circuit board described in [1] or [2], further including a protective metal layer disposed on the upper surface of each of the terminals.

In the wiring circuit board, the protective metal layer prevents the corrosion of the terminals.

The present invention [4] includes the wiring circuit board described in described in any one of [1] to [3], wherein at least one of the terminals includes a plurality of conductive layers sequentially toward an upper side.

The present invention [5] includes the wiring circuit board described in described in [4], further including: a first conductive layer and a second conductive layer, the first conductive layer and the second conductive layer are sequentially disposed at an upper side of the insulating base layer, wherein at least one of the terminals includes the first conductive layer and the second conductive layer, and each of the wires includes one selected from the group consisting of the first conductive layer and the second conductive layer.

The wiring circuit board has a simple structure in which the conductive pattern varies in thickness depending on the functions.

The present invention [6] includes the wiring circuit board described in described in [5], wherein at least one of the terminals includes a raising member disposed between the first conductive layer and the second conductive layer.

In the wiring circuit board, a terminal includes the raising member. Thus, the upper surface of the terminal is surely located at an upper side as compared to the upper surface of the insulating cover layer covering the first wire.

The present invention [7] includes the wiring circuit board described in described in [4], further including: a first conductive layer; a second conductive layer; and a third conductive layer, the first conductive layer, the second conductive layer, and the third conductive layer are sequentially disposed at an upper side of the insulating base layer, wherein at least one of the terminals includes the first conductive layer, the second conductive layer, and the third conductive layer, and each of the wires includes one selected from the group consisting of the first conductive layer, the second conductive layer, and the third conductive layer.

The wiring circuit board has a simple structure while the conductive pattern varies in thickness depending on the functions.

Effects of the Invention

The wiring circuit board of the present invention allows the electrical connection between the element and the terminals to be easy and sure.

BRIEF DESCRIPTION OF THE DRAWINGS

FIG. 3A illustrates a step of forming a first conductive layer. FIG. 3B illustrates a step of forming a second conductive layer. FIG. 3C illustrates a step of forming an insulating cover layer. FIG. 3D illustrates a step of forming a protective metal layer.

DESCRIPTION OF THE EMBODIMENT

1. Wiring Circuit Board 1

Figure 1:
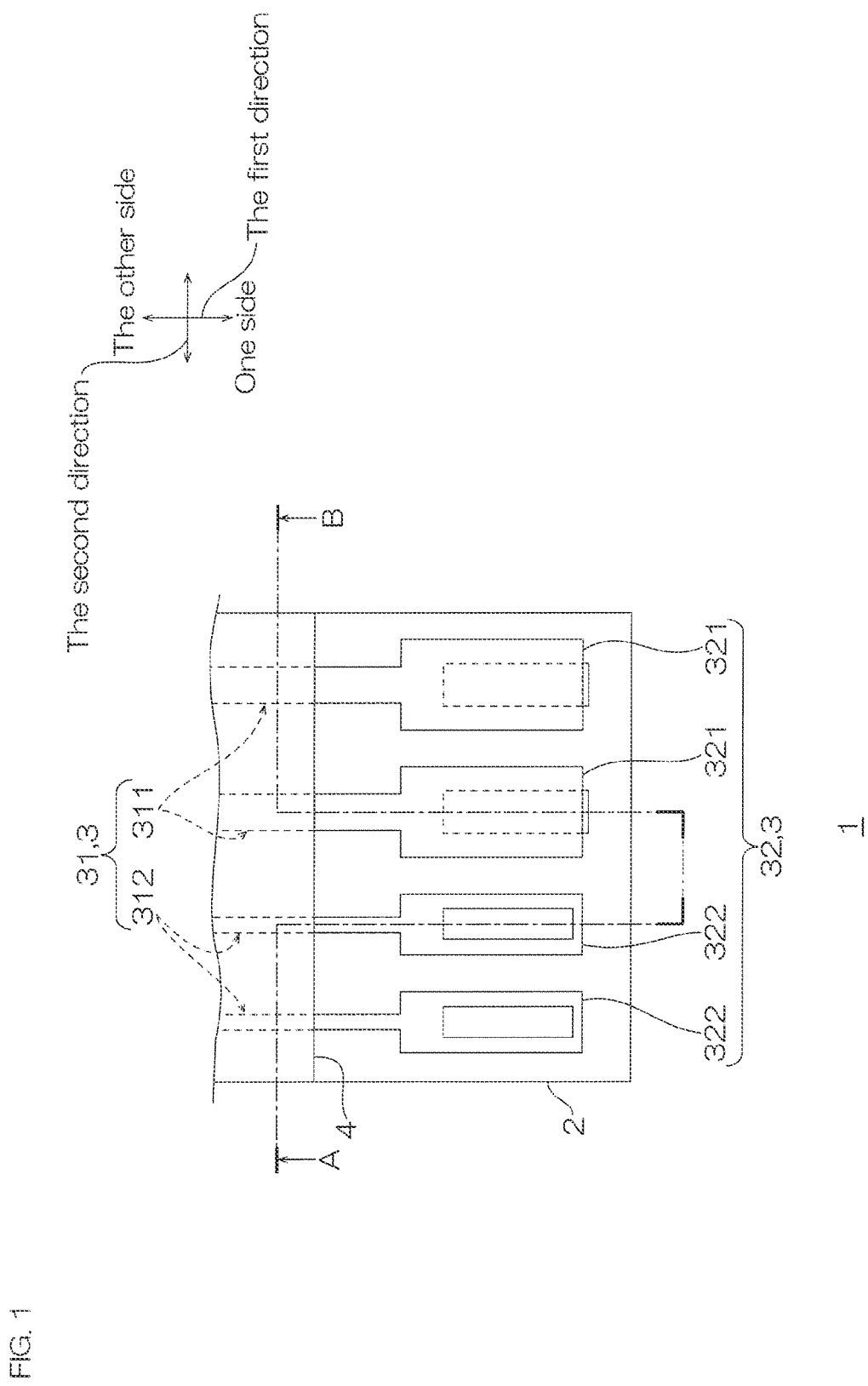
FIG. 1 is a plan view partially enlarging one embodiment of the wiring circuit board of the present invention.

One embodiment of the wiring circuit board of the present invention is described with reference to FIG. 1 and FIG. 2. A wiring circuit board 1 has a sheet shape with a thickness. The thickness is a length in an up-down direction of FIG. 2. The wiring circuit board 1 extends in a surface direction. The surface direction is orthogonal to the up-down direction. The wiring circuit board 1 includes a lower surface 11 and an upper surface 12. The lower surface 11 is flat. The upper surface 12 is separated upward from the lower surface 11 by an interval therebetween.

The wiring circuit board 1 includes an insulating base layer 2, a conductive pattern 3, an insulating cover layer 4, and a protective metal layer 5. In the present embodiment, the wiring circuit board 1 preferably includes only the insulating base layer 2, the conductive pattern 3, the insulating cover layer 4, and the protective metal layer 5.

1.1 Insulating Base Layer 2

The insulating base layer 2 has an outer shape identical to that of the wiring circuit board 1. The insulating base layer 2 forms the lower surface 11 of the wiring circuit board 1. The insulating base layer 2 has a sheet shape with a thickness. The insulating base layer 2 has a lower surface and an upper surface, both of which are flat. The upper surface is parallel to the lower surface. Examples of the material of the insulating base layer 2 include insulating resin. Examples of the insulating resin include polyimide. The insulating base layer 2 has a thickness of, for example, 1 μm or more, for example, 1000 μm or less.

1.2 Conductive Pattern 3

The conductive pattern 3 is disposed on an upper surface of the insulating base layer 2. Examples of the material of the conductive pattern 3 include copper, silver, gold, iron, aluminum, chromium, and alloys thereof. To achieve good electric properties, copper and a copper alloy are preferable as the material of the conductive layer 3. The conductive pattern 3 includes a plurality of wires 31 and a plurality of terminals 32.

The wires 31 vary in thickness, that is, the wires 31 have different thicknesses from each other. The wires 31 include a first wire 311 and a second wire 312.

Each of the first wire 311 and the second wire 312 extends in a first direction. The first direction is included in the surface direction. The first wire 311 and the second wire 312 are separated from each other by an interval therebetween in a second direction. The second direction is included in the surface direction and orthogonal to the first direction. The first wire 311 is thicker than the second wire 312. In other words, in the present embodiment, the first wire 311 is the thickest among the wires 31.

The first wire 311 is, for example, a large current wire for transmitting a relatively large amount of current (a large amount of current of, for example, 1 A or more or 10 A or more). Examples of the first wire 311 include power wires (power source wires). The first wire 311 has a thickness of, for example, 2 μm or more, preferably 5 μm or more, more preferably 10 μm or more, and, for example, 300 μm or less.

The second wire 312 is independent (electrically independent) from the first wire 311. The second wire 312 is, for example, a small current wire for transmitting a small amount of current (for example, of 1 A) as compared to the current (large current) transmitted by the first wire 311. Examples of the second wire 312 include signal wires (such as differential wires) and ground wires (such as grounding wires). The second wire 312 has a thickness of, for example, 200 μm or less, preferably 100 μm or less, more preferably 50 μm or less, and, for example, 1 μm or more. The ratio of the thickness of the first wire 311 to the thickness of the second wire 312 is, for example, 1.1 or more, preferably 1.25 or more, more preferably 1.5 or more, even more preferably 1.75 or more, particularly preferably 2.0 or more, and, for example, 100 or less, preferably 50 or less.

The layer structure of each of the wires 31 is described below.

The terminals 32 are provided corresponding to the wires 31. The terminals 32 are disposed in parallel and separated from each other by an interval therebetween in the second direction. The terminals 32 include a first terminal 321 and a second terminal 322.

The first terminal 321 continues to one edge of the first wire 311 in the first direction. The first terminal 321 is electrically connected to the first wire 311. In the plan view, the first terminal 321 has a rectangular land shape with a long side in the first direction. Examples of the first terminal 321 include signal terminals and grounding terminals. A signal terminal inputs and outputs a power source current to/from an element 8 (described below).

The first terminal 321 is thicker than the first wire 311. Specifically, an upper surface 321A of the first terminal 321 is located at an upper side as compared to an upper surface 311A of the first wire 311. The number of the first terminals 321 may be one, or two or more.

The second terminal 322 continues to one edge of the second wire 312 in the first direction. The second terminal 322 is electrically connected to the second wire 312. In the plan view, the second terminal 322 has a rectangular land shape with a long side in the first direction. Examples of the second terminal 322 include power source terminals. A power source terminal inputs and outputs a signal, for example, to/from the element 8. The second terminal 322 is thicker than the second wire 312. Specifically, an upper surface 322A of the second terminal 322 is located at an upper side as compared to an upper surface 312A of the second wire 312. The number of the second terminals 322 may be one, or two or more.

In the present embodiment, for example, the first terminal 321 and the second terminal 322 have the same thickness. Specifically, the upper surface 321A of the first terminal 321 and the upper surface 322A of the second terminal 322 are located at the same location in the up-down direction. In the present embodiment, the upper surface 321A of the first terminal 321 and the upper surface 322A of the second terminal 322 are located at the uppermost side of the conductive pattern 3.

1.2.1 Layer Structure of Conductive Pattern 3

The layer structure of the conductive pattern 3 is described. In the present embodiment, among the terminals 32, each of the first terminal 321 and the second terminal 322 sequentially includes a plurality of conductive layers 33. The conductive layers 33 include a first conductive layer 331 and a second conductive layer 332 sequentially toward an upper side. In the present embodiment, each of the first terminal 321 and the second terminal 322 includes a first conductive layer 331 and a second conductive layer 332 sequentially toward an upper side. At one side, the first wire 311 consists of the second conductive layer 332. At the other side, the second wire 312 consists of the first conductive layer 331.

1.2.2 First Conductive Layer 331

The first conductive layers 331 are disposed on the upper surface of the insulating base layer 2. The first conductive layers 331 are included in the first terminal 321, the second terminal 322, and the second wire 312, respectively.

1.2.3 Second Conductive Layer 332

In the present embodiment, the second conductive layer 332 is thicker than the first conductive layer 331. The second conductive layers 332 corresponding to the wires 31 are disposed on the upper surface of the insulating base layer 2. The second conductive layers 332 corresponding to the terminals 32 are disposed on the upper surface of the first conductive layers 331 corresponding to the terminals 32. In other words, the second conductive layers 332 are included in the first terminal 321, the second terminal 322, and the first wire 311, respectively. As described above, the first terminal 321 and the second terminal 322 are thicker than the first wire 311 and the second wire 312, respectively. In other words, each of the upper surface 321A of the first terminal 321 and the upper surface 322A of the second terminal 322 is located at an upper side as compared to each of the upper surface 311A of the first wire 311 and the upper surface 312A of the second wire 312.

1.3 Insulating Cover Layer 4

The insulating cover layer 4 is disposed on the upper surface of the insulating base layer 2. Further, the insulating cover layer 4 covers the wires 31. The insulating cover layer 4 is disposed on the upper surface and side surfaces of each of the wires 31. In this manner, the wiring circuit board 1 includes the insulating base layer 2, the wires 31, and the insulating cover layer 4 toward the upper side. Meanwhile, the terminals 32 are exposed from the insulating cover layer 4. Specifically, when being projected in the up-down direction, the insulating cover layer 4 does not overlap the terminals 32. Examples of the material of the insulating cover layer 4 include insulating resin. Examples of the insulating resin include polyimide.

The insulating cover layer 4 covering the first wire 311 is described. Hereinafter, the insulating cover layer 4 covering the first wire 311 is referred to as a wire covering portion 41. An upper surface 41A of the wire covering portion 41 is located at a lower side as compared each of the upper surface 321A of the first terminal 321 and the upper surface 322A of the second terminal 322. In other words, each of the upper surface 321A of the first terminal 321 and the upper surface 322A of the second terminal 322 is located at an upper side as compared to the upper surface 41A of the wire covering portion 41.

Each of the upper surface 321A of the first terminal 321 and the upper surface 322A of the second terminal 322 is, for example, 1 µm or more, preferably 2 µm or more, more preferably 5 µm or more above the upper surface 41A of the wire covering portion 41, and, for example, 100 µm or less above the upper surface 41A of the wire covering portion 41. In other words, the difference D between each of the upper surface 321A of the first terminal 321 and the upper surface 322A of the second terminal 322, and the upper surface 41A of the wire covering portion 41 is, for example, 1 µm or more, preferably 2 µm or more, more preferably 5 µm or more, and, for example, 100 µm or less in the up-down direction. Thus, when the element 8 is moved downward to the first terminal 321 and the second terminal 322, the contact of the element 8 with the upper surface 41A of the wire covering portion 41 can surely be suppressed.

In the present embodiment, the wire covering portion 41 is thinner than, for example, each of the first conductive layer 331 and the second conductive layer 332. Particularly, the wire covering portion 40 is thinner than the first conductive layer 331. The thickness of the wire covering portion 41 is a length between the upper surface of the wire covering portion 41 and the upper surface 311A of the first wire 311 in the up-down direction. The thickness of the wire covering portion 41 is, for example, 100 µm or less, preferably 50 µm or less, more preferably 20 µm or less, and, for example, 1 µm or more.

1.4 Protective Metal Layer 5

The protective metal layer 5 is disposed on the upper surface and side surfaces of each of the terminals 32. The protective metal layer 5 protects the upper surface and side surfaces of each of the terminals 32. The protective metal layer 5 has a thin film shape in conformity with the shape of the surface of each of the terminals 32. The thickness of the protective metal layer 5 is smaller than the thickness of the wire covering portion 41. Specifically, the thickness of the protective metal layer 5 is, for example, 0.01 µm or more, preferably 0.02 µm or more, more preferably 0.05 µm or more, and, for example, 10 µm or less. The ratio of the thickness of the protective metal layer 5 to the thickness of the insulating cover layer 4 is, for example, 0.1 or less, preferably 0.01 or less, and, for example, 0.00001 or more. Examples of the material of the protective metal layer 5 include corrosion-resistant materials. Examples of the corrosion-resistant material include nickel and gold. In the present embodiment, the material of the protective metal layer 5 is preferably different from that of the conductive pattern 3. The protective metal layer 5 is single-layered or multiple-layered.

1.5 Method of Producing Wiring Circuit Board 1

A method of producing the wiring circuit board 1 is described with reference to FIGS. 3A to 3D. As illustrated in FIGS. 3A to 3D, the method of producing the wiring circuit board 1 includes, for example, a first step, a second step, a third step, a fourth step, and a fifth step.

1.5.1 The First Step

Figure 3A:
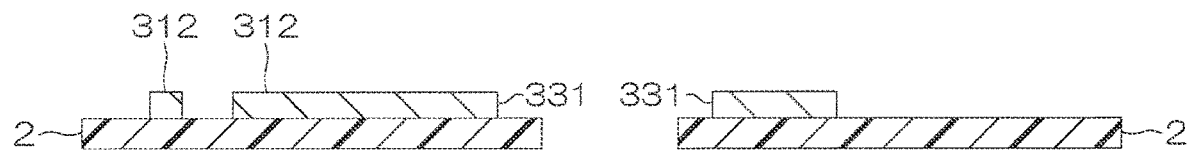
FIG. 3A to FIG. 3D illustrate the steps of producing the wiring circuit board of FIG. 2.

As illustrated in FIG. 3A, the insulating base layer 2 is prepared in the first step. For example, the above-described resin is applied on the surface of a supporting sheet not illustrated, and, as necessary, photolithography is carried out to form the insulating base layer 2 into an appropriate pattern. Alternatively, an insulating base layer 2 that is formed into a sheet shape in advance is prepared without any change.

1.5.2 The Second Step

Figure 3B:
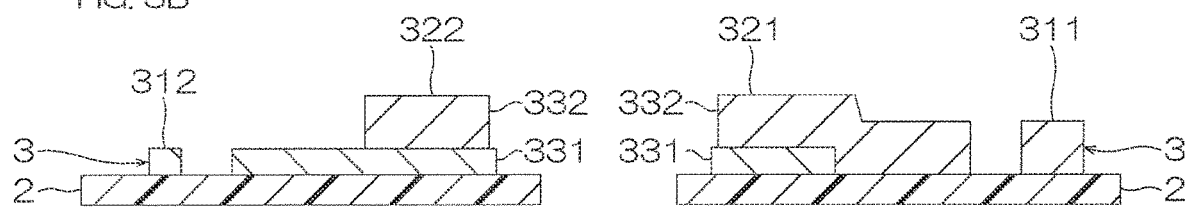

As illustrated in FIG. 3A and FIG. 3B, the conductive pattern 3 is formed on the upper surface of the insulating base layer 2 in the second step. The second step includes a step of forming the first conductive layer 331 and a step of forming the second conductive layer 332.

1.5.2.1 Step of Forming First Conductive Layer 331

As illustrated in FIG. 3A, in the step of forming the first conductive layer 331, the first conductive layer 331 is formed on the upper surface of the insulating base layer 2 by an additive method or a subtractive method. In this manner, the second wire 312 consisting of the first conductive layer 331 is formed.

1.5.2.2 Step of Forming Second Conductive Layer 332

Next, as illustrated in FIG. 3B, the second conductive layer 332 is formed on the upper surfaces of parts of the first conductive layer 331 corresponding to the first terminal 321 and the second terminal 322 and on the upper surface of the insulating base layer 2 by an additive method or a subtractive method. In this manner, the first wire 311 consisting of the second conductive layer 332 is formed. At the same time, each of the first terminal 321 and the second terminal 322, in both of which the first conductive layer 331 and the second conductive layer 332 are sequentially disposed, are formed.

1.5.3 The Third Step

Figure 3C:
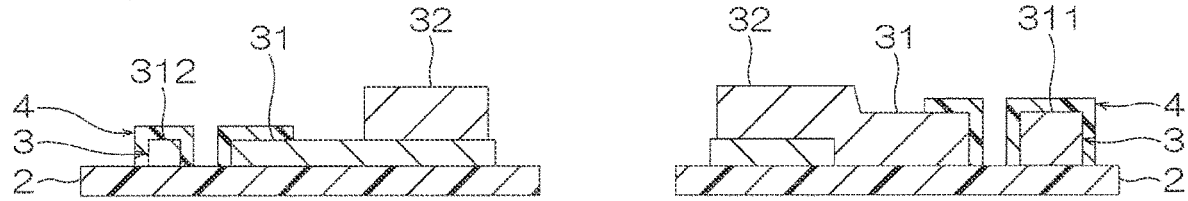

As illustrated in FIG. 3C, in the third step, the insulating cover layer 4 is disposed on a one-side surface in the thickness direction of the insulating base layer 2 to cover the wires 31. For example, a photosensitive resin is applied to the insulating base layer 2 and the conductive pattern 3, and photolithography is carried out to form a pattern from which the terminals 32 are exposed.

1.5.4 The Fourth Step

Figure 3D:
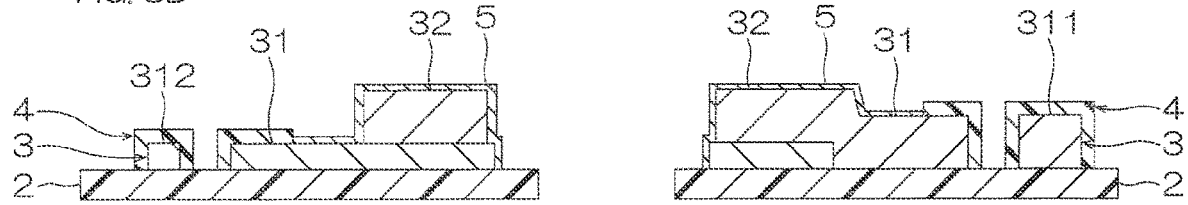

As illustrated in FIG. 3D, in the fourth step, the protective metal layer 5 is formed on the surface of the terminal 32, for example, by plating.

1.6 Connection between Wiring Circuit Board 1 and Element 8

Figure 2:
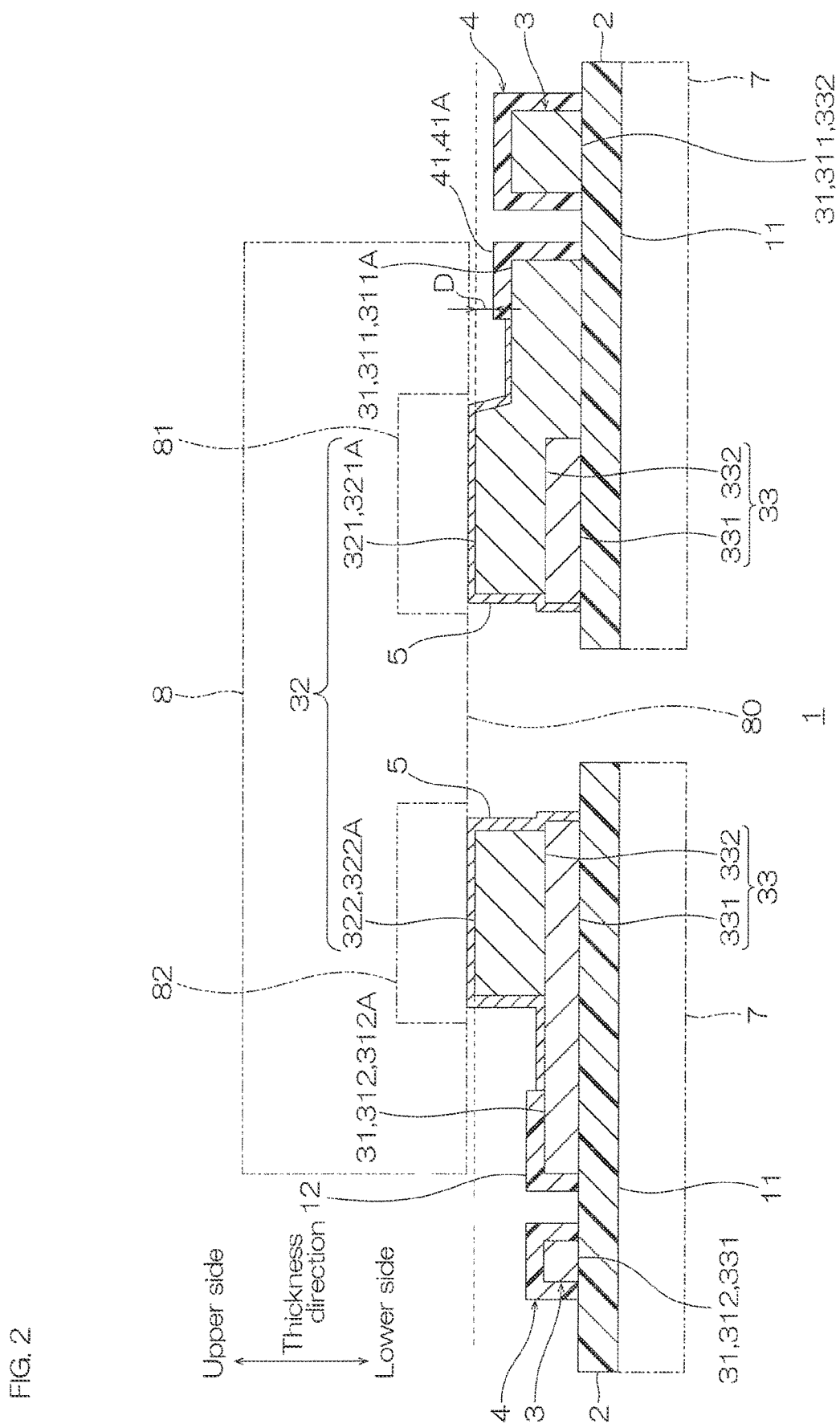
FIG. 2 is a cross-sectional view of the wiring circuit board of FIG. 1, taken along line A-B.

As the phantom lines of FIG. 2 show, the element 8 is disposed at an upper side of the terminals 32 in the wiring circuit board 1, being separated from the terminals 32 by an interval therebetween. The element 8 has an approximate box shape in the cross-sectional view. A lower surface 80 of the element 8 is flat. The lower surface 80 of the element 8 includes a first electrode 81 and a second electrode 82. The first electrode 81 is, for example, a power source electrode. The second electrode 82 is, for example, a signal electrode or a grounding electrode.

Next, the element 8 is moved closer to the upper surface 12 of the wiring circuit board 1. Specifically, the first electrode 81 is moved closer to the upper surface 321A of the first terminal 321. The second electrode 82 is moved closer to the upper surface 322A of the second terminal 322.

In this manner, the first terminal 321 is electrically connected to the first electrode 81. The second terminal 322 is electrically connected to the second electrode 82.

2. Operations and Effects of One Embodiment

In the wiring circuit board 1, each of the upper surface 321A of the first terminal 321 and the upper surface 322A of the second terminal 322 is located at an upper side as compared to the upper surface 41A of the wire covering portion 41. Thus, when the element 8 is moved downward to the first terminal 321 and the second terminal 322, the contact of the lower surface 80 of the element 8 with the upper surface 41A of the wire covering portion 41 is suppressed. Therefore, the first electrode 81 and the second electrode 82 are easily and surely connected to the upper surface 321A of the first terminal 321 and the upper surface 322A of the second terminal 322, respectively.

In the wiring circuit board 1, each of the upper surface 321A of the first terminal 321 and the upper surface 322A of the second terminal 322 is, for example, 1 µm or more above the upper surface 41A of the wire covering portion 41. Thus, the contact of the lower surface 80 of the element 8 with the upper surface 41A of the wire covering portion 41 is more surely suppressed.

The wiring circuit board 1 further includes the protective metal layer 5. Thus, the corrosion of the terminals 32 is prevented.

In the wiring circuit board 1, each of the first terminal 321 and the second terminal 322 includes the first conductive layer 331 and the second conductive layer 332. Meanwhile, the first wire 311 consists of the second conductive layer 332 whereas the second wire 312 consists of the first conductive layer 331. As described above, in the conductive pattern 3, the wires 31, which have different thicknesses from each other, and the terminals 32, which are thicker than the wires 31 and have the same thickness, are formed from the above-described first conductive layer 331 and second conductive layer 332. Thus, the wiring circuit board 1 has a simple structure while the conductive pattern 3 varies in thickness depending of the functions.

3. Variations

In each of the variations, the same members and steps as in one embodiment will be given the same reference numerals and the detailed descriptions thereof will be omitted. Further, each of the variations can have the same operations and effects as those of one embodiment unless especially described otherwise. Furthermore, one embodiment and the variations can appropriately be combined.

3.1 The First Variation

Figure 4:
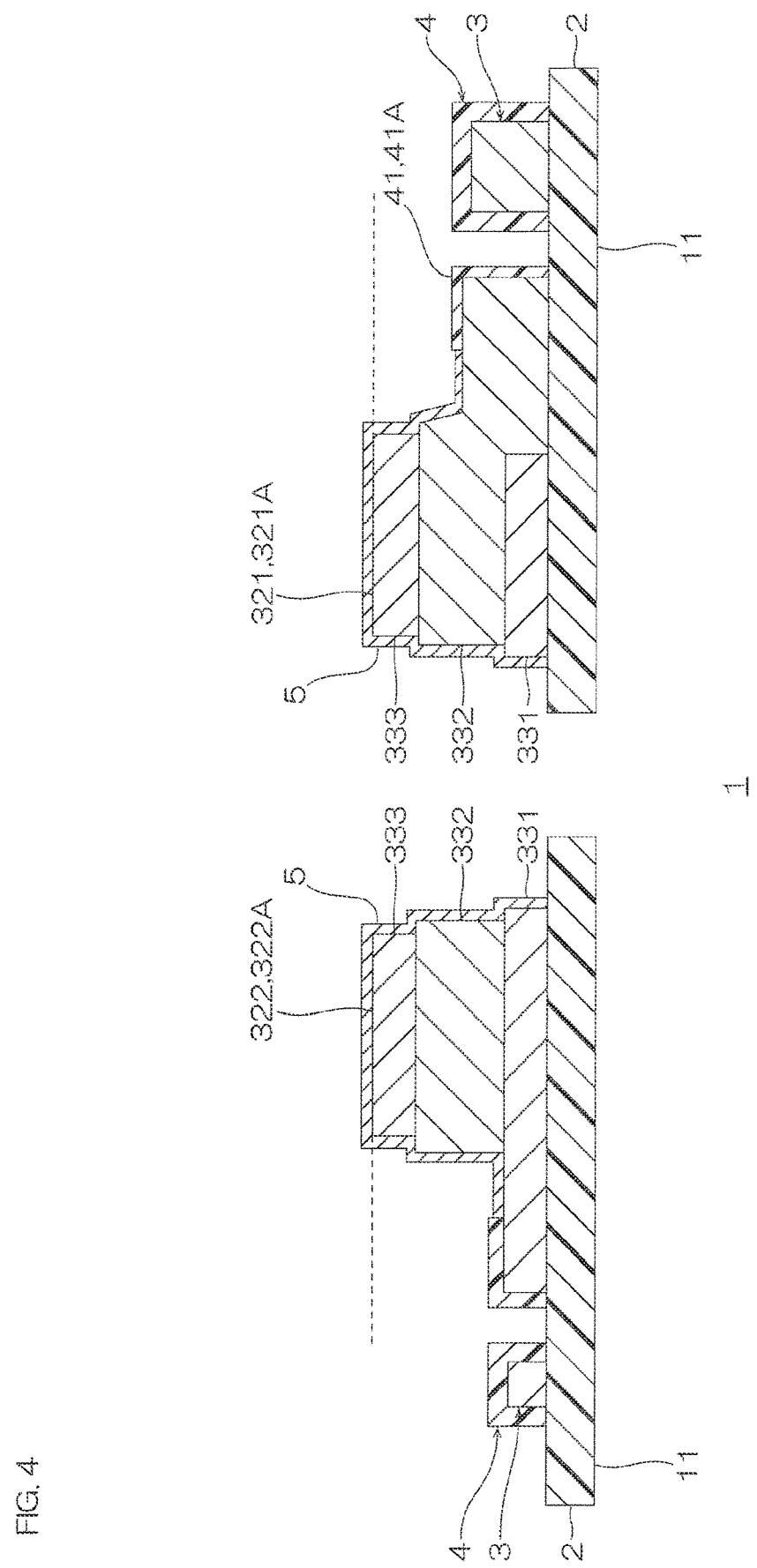
FIG. 4 is a cross-sectional view of the first variation.

As illustrated as FIG. 4, the conductive pattern 3 further includes a third conductive layer 333.

As shown at the left side of FIG. 4, for example, the third conductive layer 333 is disposed on the upper surface of the second conductive layer 332 of each of the first terminal 321 and the second terminal 322.

In the first variation, each of the first terminal 321 and the second terminal 322 includes the first conductive layer 331, the second conductive layer 332, and the third conductive layer 333 sequentially toward an upper side. Thus, each of the upper surface 321A of the first terminal 321 and the upper surface 322A of the second terminal 322 is surely located at an upper side as compared to the upper surface 41A of the wire covering portion 41.

The first variation has a simple structure while the conductive pattern 3 including the first conductive layer 331, the second conductive layer 332, and the third conductive layer 33 varies in thickness depending on their functions.

3.2 The Second Variation

Figure 5:
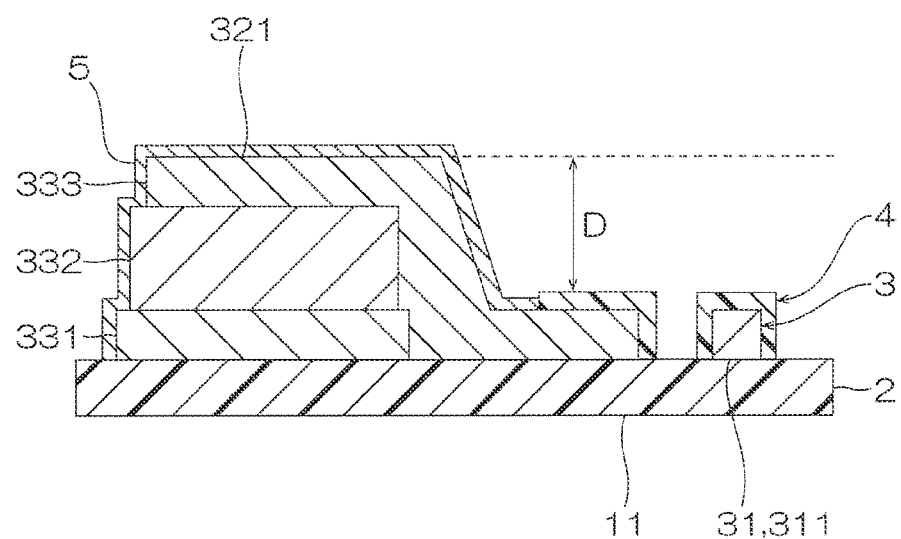
FIG. 5 is a cross-sectional view of the second variation.

As illustrated in FIG. 5, the third conductive layer 333 is included also in the first wire 311. On the other hand, the second conductive layer 332 is not included in the first wire 311.

3.3 The Third Variation

Figure 6:
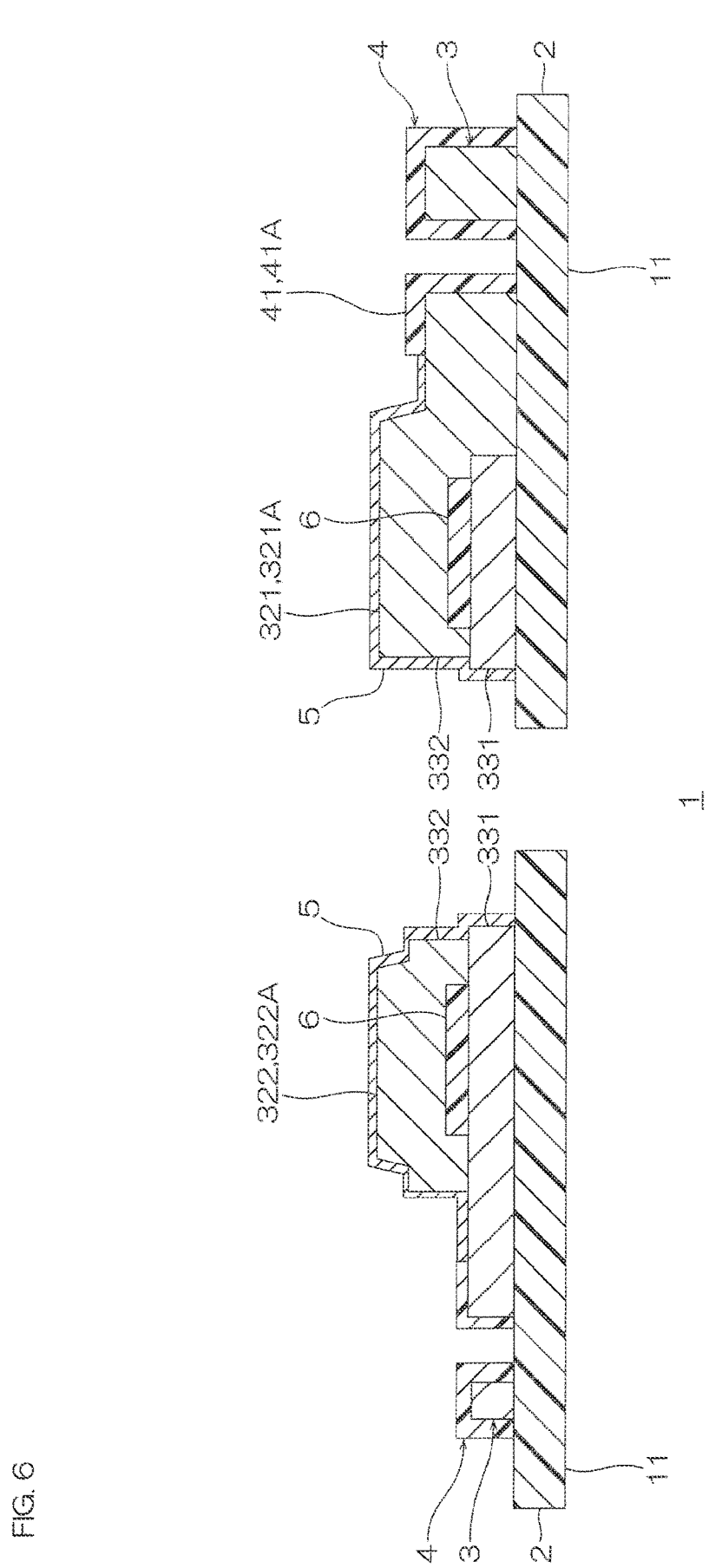
FIG. 6 is a cross-sectional view of the third variation.

As illustrated in FIG. 6, each of the first terminal 321 and the second terminal 322 includes a raising member 6. The raising member 6 raises each of the upper surface 321A of the first terminal 321 and the upper surface 322A of the second terminal 322 to an upper side. The raising member 6 has a board shape. The raising member 6 is included in the outer shape of each of the first terminal 321 and the second terminal 322 when being projected in the up-down direction. In each of the first terminal 321 and the second terminal 322, the peripheral edge portion of the first conductive layer 331 is in contact with the peripheral edge portion of the second conductive layer 332 around the raising member 6. In the present embodiment, the material of the raising member 6 is an insulating material. In the present embodiment, the material of the raising member 6 is the same as that of the insulating cover layer 4 (preferably, polyimide). The raising member 6 has a thickness of, for example, 1 µm or more, preferably 2 µm or more, more preferably 5 µm or more, and, for example, 100 µm or less. Preferably, the thickness of the raising member 6 is identical to the thickness of the insulating cover layer 4.

In the third variation, each of the first terminal 321 and the second terminal 322 includes the raising member 6. Thus, each of the upper surface 321A of the first terminal 321 and the upper surface 322A of the second terminal 322 is surely located at an upper side as compared to the upper surface 41A of the wire covering portion 41.

3.4 The Fourth Variation

Figure 7:
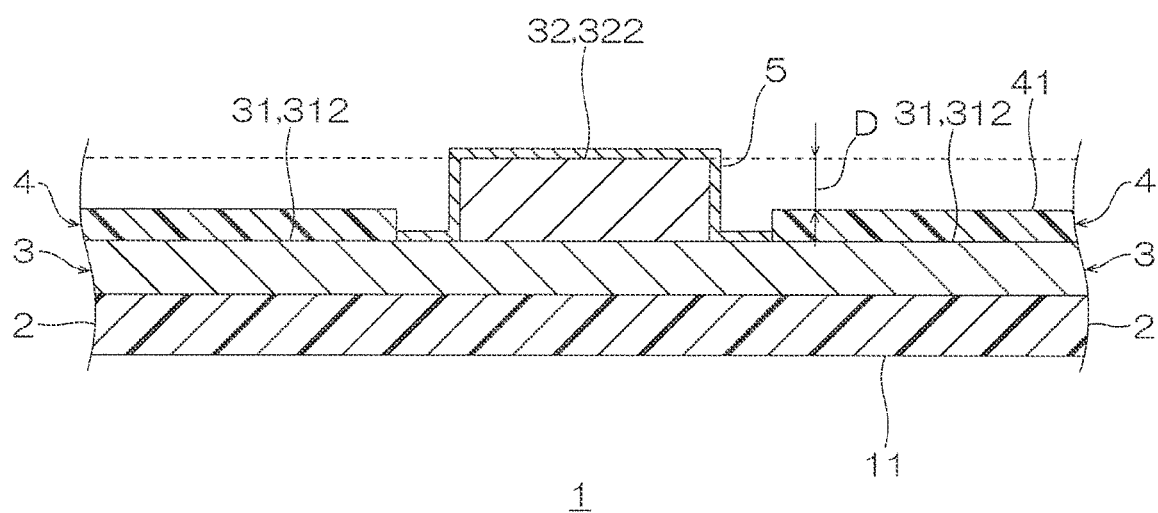
FIG. 7 is a cross-sectional view of the fourth variation.

As illustrated in FIG. 7, the second terminal 322 may intervene in an intermediate part of the second wire 312 in the first direction.

3.5 The Fifth Variation

As the phantom lines of FIG. 2 show, the wiring circuit board 1 further include a metal supporting board 7. The metal supporting board 7 is disposed on the lower surface of the insulating base layer 2. Examples of the material of the metal supporting board 7 include iron, stainless steels, copper, and copper alloys.

While the illustrative embodiments of the present invention are provided in the above description, such is for illustrative purpose only and it is not to be construed as limiting in any manner Modification and variation of the present invention that will be obvious to those skilled in the art is to be covered by the following claims.

DESCRIPTION OF REFERENCE NUMERALS 1 wiring circuit board
2 insulating base layer
3 conductive pattern
31 wires
32 terminals
33 conductive layers
311 first wire
311A upper surface of the first wire
321A upper surface of the first terminal
322A upper surface of the second terminal
331 first conductive layer
332 second conductive layer
333 third conductive layer
4 insulating cover layer
41A upper surface of the wire covering portion
5 protective metal layer
6 raising member

The invention claimed is:

1. A wiring circuit board comprising:
an insulating base layer;
a plurality of wires with different thicknesses from each other; and
an insulating cover layer sequentially toward an upper side, wherein
the plurality of wires include a first wire being the thickest wire among the plurality of wires,
the wiring circuit board further comprises a plurality of terminals disposed on an upper surface of the insulating base layer, the terminals are electrically connected with the wires, respectively, and
an upper surface of each of the terminals is located at an upper side as compared to an upper surface of the insulating cover layer covering the first wire.

2. The wiring circuit board according to claim 1, wherein the upper surface of each of the terminals is located 1 μm or more above the upper surface of the insulating cover layer.

3. The wiring circuit board according to claim 1, further comprising a protective metal layer disposed on the upper surface of each of the terminals.

4. The wiring circuit board according to claim 1, wherein at least one of the terminals includes a plurality of conductive layers sequentially toward an upper side.

5. The wiring circuit board according to claim 4, further comprising: a first conductive layer and a second conductive layer, the first conductive layer and the second conductive layer are sequentially disposed at an upper side of the insulating base layer, wherein
at least one of the terminals includes the first conductive layer and the second conductive layer, and
each of the wires includes one selected from the group consisting of the first conductive layer and the second conductive layer.

6. The wiring circuit board according to claim 5, wherein at least one of the terminals includes a raising member disposed between the first conductive layer and the second conductive layer.

7. The wiring circuit board according to claim 4, further comprising:
a first conductive layer;
a second conductive layer; and
a third conductive layer, the first conductive layer, the second conductive layer, and the third conductive layer are sequentially disposed at an upper side of the insulating base layer, wherein
at least one of the terminals includes the first conductive layer, the second conductive layer, and the third conductive layer, and
each of the wires includes one selected from the group consisting of the first conductive layer, the second conductive layer, and the third conductive layer.

* * * * *